Sept. 26, 1967 E. P. DONOVAN 3,343,255
STRUCTURES FOR SEMICONDUCTOR INTEGRATED
CIRCUITS AND METHODS OF FORMING THEM
Filed June 14, 1965

WITNESSES:
John L. Chopp
James F. Young

INVENTOR
Eugene P. Donovan
BY Gordon H. Telfer
ATTORNEY

United States Patent Office 3,343,255
Patented Sept. 26, 1967

3,343,255
STRUCTURES FOR SEMICONDUCTOR INTEGRATED CIRCUITS AND METHODS OF FORMING THEM

Eugene P. Donovan, Glen Burnie, Md., assignor to Westinghouse Electric Corporation, Pittsburgh, Pa., a corporation of Pennsylvania Filed June 14, 1965, Ser. No. 463,702
4 Claims. (Cl. 29—577)

ABSTRACT OF THE DISCLOSURE

Dielectric isolated integrated circuits fabricated by first completing all the diffusion operations, including any heavy ion diffusion to kill lifetime, and separating the elements of the integrated circuit while the structure is supported on its face using a dissolvable solder layer that permits removal of the support after the space between elements is filled with an insulating material such as low melting glass.

Figure 1:
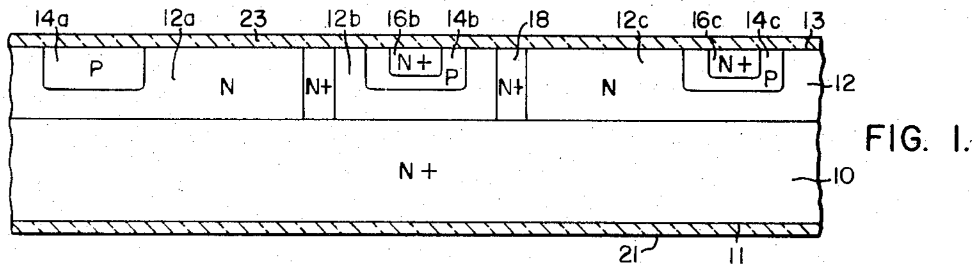

This invention relates to semiconductor devices and, more particularly, to semiconductor structures suitable for semiconductor integrated circuits and methods of making them.

Some recent proposals have been advanced for fabrication of integrated circuits wherein the functional portions that provide the functions of active and passive electronic components (such as transistors, diodes, resistors and capacitors) are isolated by a dielectric material that improves over the prior art utilization of back-to-back p-n junctions for isolation in that it reduces the capacitance between the elements and provides higher breakdown voltages. For information on the nature of the isolation problem and prior proposals for dielectric isolation, reference should be made to copending application Ser. No. 410,666, filed Nov. 12, 1964 by Murphy et al. and Ser. No. 444,208, filed Mar. 31, 1965, by Joyce, both of which are assigned to the assignee of the present invention.

While previous schemes can satisfactorily achieve structures with dielectric isolation, some problems are still encountered such as in the fabrication of integrated circuits for high speed switching functions such as logic gates. When p-n junction isolation is used these blocks are conventionally diffused with a heavy metal ion such as gold to kill carrier lifetime. However, with dielectric isolation schemes as previously proposed such gold diffusion cannot be readily performed from the back surface of the device opposite to that on which the device portions are fabricated because of the existence of the dielectric isolating material. It is undesirable to introduce the gold through the top surface because controlled uniform doping of the desired concentration cannot be readily achieved.

Another problem occurs because the physical separation of the device portions may cause the structure to become mechanically weak so as to require great care in handling to prevent breakage.

It is, therefore, an object of the present invention to provide improved structures for semiconductor integrated circuits having a dielectric medium for isolation.

It is another object of the present invention to provide an improved method of forming a semiconductor structure for integrated circuits wtih dielectric isolation that readily permits the introduction of a heavy metal ion such as gold in order to kill carrier lifetime within the semiconductor material.

Another object is to provide a method of providing a semiconductor structure for an integrated circuit that provides sufficient means for handling the structure after the formation of isolated portions therein.

Another object is to provide an improved method for fabricating integrated circuit structures wherein the surface on which devices are fabricated is not affected by the process in which the device portions are isolated.

Another object is to provide a method of forming an integrated circuit structure that inherently permits the formation of transistor structures within the integrated circuit with low saturation resistance.

The invention achieves the above-mentioned and additional objects and advantages by, briefly, first performing the operations on the semiconductor body for the device portions, that is, including all the diffusions necessary for devices. These typically include two diffusions for base and emitter regions in transistors and the gold diffusion to kill carrier lifetime in the case of high speed devices. The planar surface on which the devices are disposed is completely protected by an oxide layer that may be formed during or following the final diffusion operation. The structure is then placed face down on a rigid support member such as a quartz plate and is joined thereto by a material that will be referred to herein sometimes as a solder material that permits subsequent separation of the semiconductor device structure from the support member. Following the mounting as described the semiconductor device portions are separated as by etching isolation grooves on the back surface of the device that are filled with an insulating material, such as glass, following which the support member is removed from the face of the device. Further fabrication operations such as the formation of ohmic contacts and interconnections and any thin film elements to be disposed on the surface of the wafer are performed and the device encapsulated. A sufficient quantity of the isolating material can be disposed on the back surface of the device to form a mechanically strong structure which permits joining to a body of thermally conductive material for mounting and encapsulation.

The invention, together with the above-mentioned and additional objects and advantages thereof, will be better understood by reference to the following description taken with the accompanying drawing, wherein:

FIGURES 1 through 4 are partial sectional views at successive stages in a fabrication process in accordance with the present invention.

Referring to FIG. 1, the starting material 10 is preferably of relatively low resistivity material, here designated N+, so selected because it will reduce saturation resistance in transistor structures in the ultimate integrated circuit. Of course, the semiconductivity type of the various regions may be reversed from that shown. A typical suitable resistivity for the starting material is about 0.1 ohm-centimeter to about 1 ohm-centimeter. The starting material should have a substantially planar surface having suitable orientation, such as near <111>, for the epitaxial growth of material thereon. The discussion herein contemplates that the starting material 10 is of silicon although it will be understood that other semiconductive materials may be employed.

On the surface of the starting material 10 there is grown a layer 12 of epitaxial material of the same semiconductivity type as the starting material but having higher resistivity as is desirable at the base-collector junction of transistors such as resistivity of about 1 to 10 ohm-centimeters. The thickness of the epitaxial layer 12 should be at least thick enough to permit formation of the transistor base regions therein such as about 5 microns.

In the partial structure shown, three device portions 12*a*, 12*b* and 12*c* are illustrated within the layer 12. They each include p type regions 14*a*, 14*b* and 14*c*, the latter two of which have n+ type regions 16*b* and 16*c* therein respectively. Consequently, these device portions provide, respectively, resistor, transistor and diode (or capacitor) functional elements. In the center portion intended for transistor fabrication an N+ collector wall 18 surrounds the base region 14*b* and extends to the N+ substrate 10.

The structure of FIG. 1 is complete as to the requisite diffusion operations including those to form the device portions and also the heavy metal ion diffusion if used to kill carrier lifetime. The metal used to kill carrier lifetime is preferably gold although other heavy metals such as nickel and copper may be used. The latter diffusion may readily be performed from the bottom surface by the techniques that have previously become conventional as by evaporating a layer of gold onto the bottom surface, heating briefly to the gold-silicon eutectic temperature to achieve the desired gold diffusion throughout the entire structure and then removing a small portion of the wafer having the gold layer thereon. Following the diffusions the structure is as shown with insulating layers 21 and 23, conveniently of silicon dioxide, covering the major surfaces 11 and 13 of the structure.

The performance of all the diffusion operations before isolation provides greater flexibility in the selection of the dielectric material subsequently applied for isolation. That is, in accordance with this invention, the dielectric material need not be one capable of withstanding diffusion temperatures (typically about 1200° C.).

Figure 2:
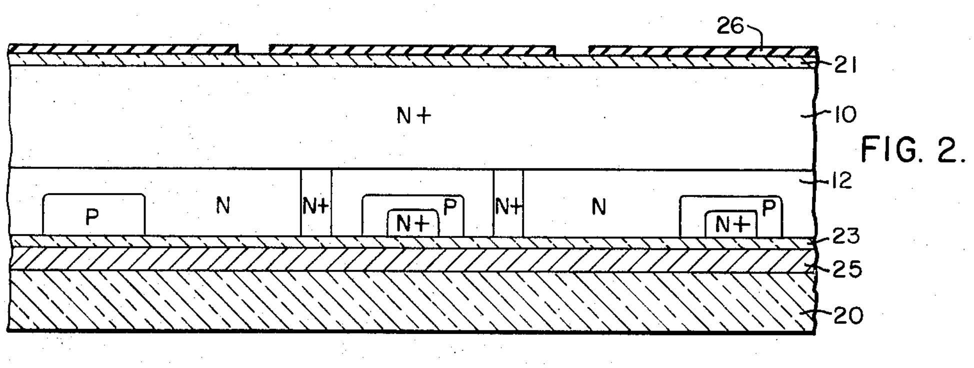
Figure 3:
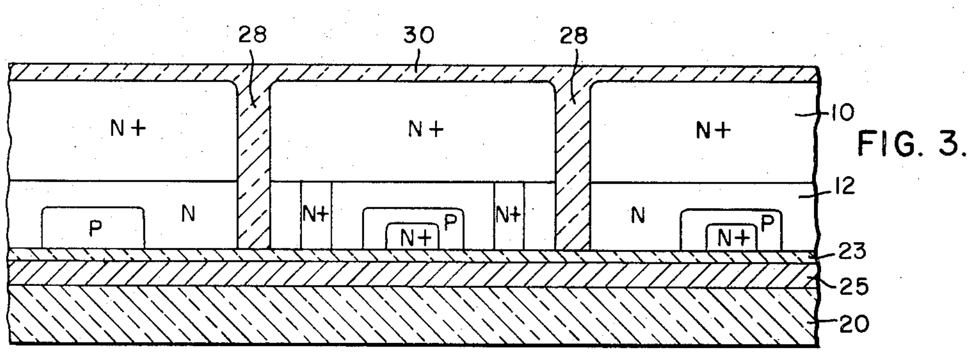

FIG. 2 shows the structure after the portion shown in FIG. 1 has been inverted and placed on a support member 20 of relatively inert material such as a quartz plate. For adhesion to the support member 20 a solder material 25 is used having a melting point that is higher than that of the dielectric material that is subsequently to be used for isolation. The material 25 is also one which is soluble in a medium to which the oxide layer 21 is stable so as to maintain continuous protection of the device portions. On the back face of the device is an isolation mask 26 of photoresist material that has been exposed and developed to form a pattern having openings only where isolation grooves are desired through the structure.

After the etching of the isolation grooves 28 (FIG. 3) by the employment of a suitable etchant which will etch all the way through the semiconductive body, the grooves are filled with an insulating material 30 selected for its ease in disposition and its dielectric properties such as a borosilicate glass or a glass that has as principal constituents germania (germanium dioxide) and silica (silicon dioxide). Such materials, often referred to as low melting glasses, can have melting points in the vicinity of 300–800° C. It is desirable that the joining solder material 23 have a higher melting point so that it will not become molten upon the introduction of the isolating material. An example is antimony that has a melting point of 630° C. and furthermore may be removed by application of sulfuric acid which will not attack the oxide protecting the semiconductor device portions or the glass that may penetrate through the oxide.

There is no problem in the practice of this invention about stopping at any critical depth in the etching of grooves 28 and no problem of mechanical support of the structure during or after the etched grooves because of the presence of the support member 20.

A further requirement of the isolating medium 30 is that its melting point be higher than the temperatures required for the formation of ohmic contacts and conductive interconnections in the ultimate structure. For example, aluminum is often used as a contact and interconnection material and requires a temperature close to the silicon aluminum eutectic of 570° C. for adequate bonding.

Figure 4:
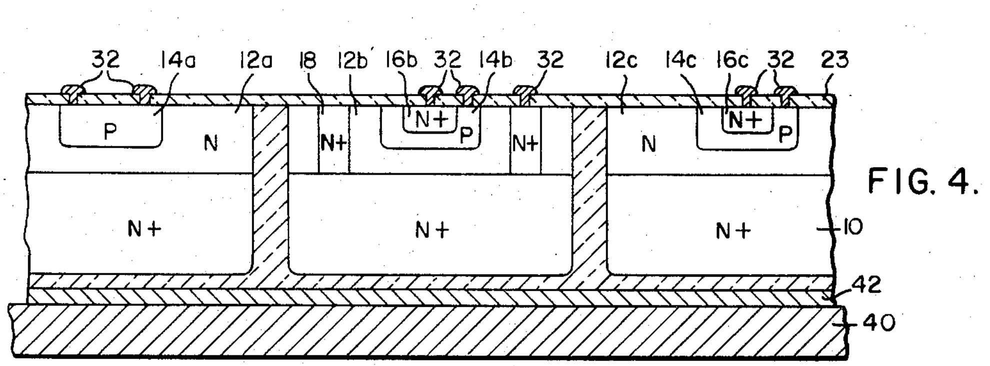

FIG. 4 shows the structure after the removal of the support member 20 and the formation of ohmic contacts 32 to the device regions so that in the left-hand portion 12*a* is a resistive region 14*a* having contacts at its extremities. In the center portion 12*b* is a transistor structure having contacts to the emitter, base and collector regions 16*b*, 14*b* and 12*b* respectively (contact to collector region 12*b* is on the higher doped wall 18) and in the right-hand portion 12*c* is a diode or capacitor structure having contacts to the two diffused regions 14*c* and 16*c*.

On the bottom surface of the device is shown a thermally conductive member 40 bonded to the structure by a suitable metallic solder 42 that will facilitate heat dissipation. Naturally such a member is not required where heat removal is not a particular problem but it does illustrate the flexibility that is permitted in the mounting and encapsulation of structures formed in accordance with the present invention. It is possible, if desired, to mix a material, such as aluminum oxide with the dielectric material 30 in order to improve its thermal conductivity.

The device structures illustrated in the portions 12*a*, 12*b* and 12*c* are, of course, merely exemplary. It is another advantage of the present invention that existing flexibility in the design of individual elements is preserved. Thin film elements may also be disposed on the surface of oxide layer 23.

As has been pointed out in the foregoing discussion, selection of some of the materials used in practicing the invention depends on the effect of temperatures to which the materials will be subjected. The following table summarizes these and other criteria:

| Material | Requirements |
|---|---|
| Passivating layer 21, e.g., silicon dioxide. | Must be stable under all temperatures and environments to which it is subject. |
| Solder material 25, e.g., antimony. | Melting point higher than that of dielectric material 30 but, for convenience, should otherwise be low; must be soluble in a solvent to which layer 21 is inert. |
| Dielectric material 30, e.g., borosilicate glass. | Melting point less than that of solder material 25 but greater than any temperature encountered during subsequent operations such as ohmic contacting and encapsulation. Must be inert to all expected conditions. |

While the present invention has been shown and described in a few forms only, it will be apparent that various changes and modifications may be made without departing from the spirit and scope thereof.

What is claimed is:

1. A method of making a semiconductor device structure suitable for an integrated circuit comprising the steps of: obtaining a unitary body of semiconductive material with a plurality of semiconductive regions disposed therein to form a plurality of electronic functional elements in a first surface; forming a layer of insulating material on said surface; mounting said unitary body by said first surface onto a support member by means of a solder layer of material having a first melting point lower than that of said insulating layer, said solder being soluble in a solvent to which said layer of insulating material is inert; separating said functional elements by severing said body between said elements and disposing therebetween a quantity of insulating material having a second melting point that is lower than said first melting point; and removing said support member from said body by action of said solvent on said solder layer.

2. The method in accordance with claim 1 including the step of joining a thermally conductive member to said quantity of insulating material.

3. The method in accordance with claim 1 wherein before said separating step said unitary body is diffused with a heavy metal ion to kill carrier lifetime.

4. The method in accordance with claim 1 wherein following the removal of said support member, ohmic contacts are applied to selected regions of said functional elements at a temperature less than said second melting point.

References Cited

UNITED STATES PATENTS

| | | | |
|---|---|---|---|
| 3,152,939 | 10/1964 | Borneman. | |
| 3,158,788 | 11/1964 | Last | 317—101 |

WILLIAM I. BROOKS, *Primary Examiner.*